(12) United States Patent
Ye et al.

(10) Patent No.: US 9,746,784 B2
(45) Date of Patent: Aug. 29, 2017

(54) LENS HEATING COMPENSATION SYSTEMS AND METHODS

(71) Applicant: ASML NETHERLANDS B.V., Veldhoven (NL)

(72) Inventors: Jun Ye, Palo Alto, CA (US); Peng Liu, Sunnyvale, CA (US); Yu Cao, Saratoga, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 708 days.

(21) Appl. No.: 14/064,937

(22) Filed: Oct. 28, 2013

(65) Prior Publication Data

US 2014/0047397 A1    Feb. 13, 2014

Related U.S. Application Data

(63) Continuation of application No. 12/475,071, filed on May 29, 2009, now Pat. No. 8,570,485.

(Continued)

(51) Int. Cl.
*G03B 27/52* (2006.01)
*G03B 27/68* (2006.01)
(Continued)

(52) U.S. Cl.
CPC .......... *G03F 7/70441* (2013.01); *G03F 7/705* (2013.01); *G03F 7/706* (2013.01);
(Continued)

(58) Field of Classification Search
CPC ...... G03F 7/70266; G03F 7/705; G03F 7/706; G03F 7/70891; G03F 17/50;
(Continued)

(56) References Cited

U.S. PATENT DOCUMENTS 5,969,441 A    10/1999  Loopstra et al.
6,046,792 A    4/2000   Van Der Werf et al.
(Continued)

FOREIGN PATENT DOCUMENTS

JP    6-326000    11/1994
JP    2001-230193    8/2001
(Continued)

OTHER PUBLICATIONS

Cao, et al., "Optimized Hardware and Software for Fast, Full Chip Simulation", Proc. SPIE, vol. 5754, p. 405, 2005.

(Continued)

*Primary Examiner* — Christina Riddle
(74) *Attorney, Agent, or Firm* — Pillsbury Winthrop Shaw Pittman LLP

(57) ABSTRACT

Methods for calibrating a photolithographic system are disclosed. A cold lens contour for a reticle design and at least one hot lens contour for the reticle design are generated from which a process window is defined. Aberrations induced by a lens manipulator are characterized in a manipulator model and the process window is optimized using the manipulator model. Aberrations are characterized by identifying variations in critical dimensions caused by lens manipulation for a plurality of manipulator settings and by modeling behavior of the manipulator as a relationship between manipulator settings and aberrations. The process window may be optimized by minimizing a cost function for a set of critical locations.

24 Claims, 17 Drawing Sheets

Related U.S. Application Data

(60) Provisional application No. 61/122,537, filed on Dec. 15, 2008, provisional application No. 61/058,502, filed on Jun. 3, 2008.

(51) Int. Cl.
*G03B 27/32* (2006.01)
*G03F 7/20* (2006.01)
*G06F 17/50* (2006.01)

(52) U.S. Cl.
CPC ...... *G03F 7/70266* (2013.01); *G03F 7/70533* (2013.01); *G03F 7/70891* (2013.01); *G06F 17/50* (2013.01)

(58) Field of Classification Search
CPC ............ G03F 7/70525; G03F 7/70533; G03F 7/70325; G03F 7/70433; G03F 7/70441; G06F 17/50
USPC ........ 355/30, 52, 55, 53, 67–71, 77; 430/30; 250/548, 492.1, 492.2, 492.22, 492.23, 250/493.1; 716/53, 54, 55
See application file for complete search history.

(56) References Cited

U.S. PATENT DOCUMENTS

| | | | |
|---|---|---|---|
| 6,578,190 B2 | 6/2003 | Ferguson et al. | |
| 7,003,758 B2 | 2/2006 | Ye et al. | |
| 7,587,704 B2 | 9/2009 | Ye et al. | |
| 7,617,477 B2 | 11/2009 | Ye et al. | |
| 7,817,247 B2 | 10/2010 | De Kruif et al. | |
| 2002/0036758 A1 | 3/2002 | De Mol et al. | |
| 2003/0095243 A1* | 5/2003 | Yu | G03B 27/52 355/55 |
| 2004/0184030 A1 | 9/2004 | Liebchen | |
| 2005/0136340 A1 | 6/2005 | Baselmans et al. | |
| 2006/0008716 A1 | 1/2006 | Jeunink et al. | |
| 2006/0114437 A1 | 6/2006 | Akhssay et al. | |
| 2006/0161452 A1* | 7/2006 | Hess | G03F 1/36 716/55 |
| 2006/0170899 A1 | 8/2006 | De Kruif et al. | |
| 2008/0086440 A1 | 4/2008 | Hoey et al. | |
| 2008/0097701 A1 | 4/2008 | Zawadzki et al. | |

FOREIGN PATENT DOCUMENTS

| | | |
|---|---|---|
| JP | 2001-244182 | 9/2001 |
| JP | 2006-024941 | 1/2006 |
| JP | 2006-179937 | 7/2006 |

OTHER PUBLICATIONS

Granik, et al., "Source Optimization for Image Fidelity and Throughput", Journal of Microlithography, Microfabrication+, Microsystems, vol. 3, No. 4, pp. 509-522, 2004.

Rosenbluth, et al., "Optimum Mask and Source Patterns to Print a Given Shape", Journal of Microlithography, Microfabrication, Microsystems, vol. 1, No. 1, pp. 13-20, 2002.

Spence, et al. , "Full Chip Lithography Simulation and Design Analysis—How OPC is Changing IC Design", Proc. SPIE, vol. 5751, pp. 1-14, 2005.

Japanese Office Action dated Jun. 19, 2012 in corresponding Japanese Patent Application No. 2011-512551.

Ichiro Mori et al., "Special Reports/Challenges and Innovations of Advanced Lithography," Toshiba Review, vol. 59, No. 8, pp. 8-12 (2004).

International Search Report dated Nov. 24, 2009 in corresponding PCT/US09/045732.

* cited by examiner

CD Error Comparison On Through-pitch Structures Across Slit: ALE Correction

Hot Spot Comparison Of Layout Clips Of DRAM Devices Between Full-chip Model And Clip Model Center And Edge Slit Contours Very Close

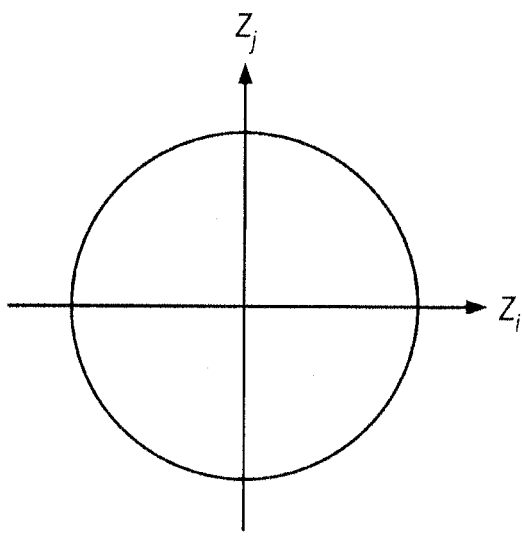
FIG. 16a
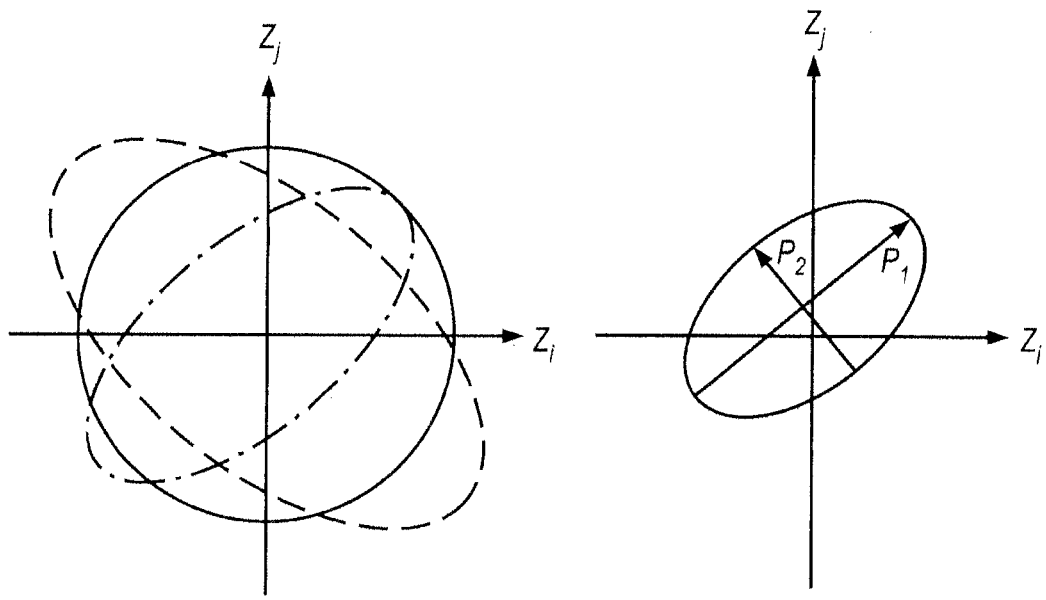
FIG. 16b
FIG. 16c

LENS HEATING COMPENSATION SYSTEMS AND METHODS

CROSS REFERENCE TO RELATED APPLICATIONS

This application is a Continuation of U.S. patent application Ser. No. 12/475,071, filed May 29, 2009, now U.S. Pat. No. 8,570,485, which claims priority to U.S. Provisional Patent Ser. No. 61/058,502 filed Jun. 3, 2008 and to U.S. Provisional Patent Ser. No. 61/122,537 filed Dec. 15, 2008, the contents of which are incorporated herein by reference in their entirety.

BACKGROUND OF THE INVENTION

Field of the Invention

The present invention relates generally to systems and methods for performing model-based scanner tuning and optimization and more particularly to optimization of performance of multiple lithography systems.

Description of Related Art

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and soft baking. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process, in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis—How OPC Is Changing IC Design", C. Spence, Proc. SPIE, Vol. 5751, pp 1-14 (2005) provides an overview of current 'model-based' optical proximity correction processes. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

The application of model-based OPC to a target design requires good process models and considerable computational resources, given the many millions of features typically present in a chip design. However, applying OPC is generally not an 'exact science', but an empirical, iterative process that does not always resolve all possible weaknesses on a layout. Therefore, post-OPC designs, i.e. mask layouts after application of all pattern modifications by OPC and any other RETs, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and methods as described, for example in, U.S. patent Ser. No. 10/815,573 and an article titled "Optimized Hardware and Software For Fast, Full Chip Simulation", by Y. Cao et al., Proc. SPIE, Vol. 5754, 405 (2005).

While full-chip numerical simulation of the lithographic patterning process has been demonstrated at a single process condition, typically best focus and best exposure dose or best 'nominal' condition, it is well known that manufacturability of a design requires sufficient tolerance of pattern fidelity against small variations in process conditions that are unavoidable during actual manufacturing. This tolerance is commonly expressed as a process window, defined as the width and height (or 'latitude') in exposure-defocus space over which CD or edge placement variations are within a predefined margin (i.e., error tolerance), for example ±10% of the nominal line width. In practice, the actual margin requirement may differ for different feature types, depending on their function and criticality. Furthermore, the process window concept can be extended to other basis parameters in addition to or besides exposure dose and defocus.

Manufacturability of a given design generally depends on the common process window of all features in a single layer. While state-of-the-art OPC application and design inspection methods are capable of optimizing and verifying a design at nominal conditions, it has been recently observed that process-window aware OPC models will be required in order to ensure manufacturability at future process nodes due to ever-decreasing tolerances and CD requirements.

Currently, in order to map out the process window of a given design with sufficient accuracy and coverage, simulations at N parameter settings (e.g., defocus and exposure dose) are required, where N can be on the order of a dozen or more. Consequently, an N-fold multiplication of computation time is necessary if these repeated simulations at various settings are directly incorporated into the framework of an OPC application and verification flow, which typically will involve a number of iterations of full-chip lithography simulations. However, such an increase in the computational time is prohibitive when attempting to validate and/or design a given target circuit.

In addition to performing the foregoing mask adjustments (e.g., OPC) in an effort to optimize the imaging results, the illumination scheme utilized in the imaging process can be also optimized, either jointly with mask optimization or separately, in an effort to improve the overall lithography fidelity. Since the 1990s, many off-axis light sources, such as annular, quadrupole, and dipole, have been introduced, and have provided more freedom for OPC design, thereby improving the imaging results. As is known, off-axis illumination is a proven way to resolve fine structures (i.e., target features) contained in the mask. However, when compared to a traditional illuminator, an off-axis illuminator usually provides less light intensity for the aerial image (AI). Thus, it becomes necessary to attempt to optimize the illuminator to achieve the optimal balance between finer resolution and reduced light intensity.

Numerous prior art illumination optimization approaches are known. For example, in an article by Rosenbluth et al., titled "Optimum Mask and Source Patterns to Print A Given Shape", Journal of Microlithography, Microfabrication, Microsystems 1(1), pp. 13-20, (2002), the source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for wafer image fidelity and the smoothness requirement of the source.

Lens heating can adversely affect the operation of photolithographic systems by causing non uniform expansion and distortions of the lens which can cause variations in nominal numerical aperture value. Lens heating can induce aberrations that can cause printing defects on wafers. The effects of lens heating on CDs are typically non-linear and, generally, conventional systems cannot use linear mathematical models as a consequence.

BRIEF SUMMARY OF THE INVENTION

Certain embodiments of the invention provide optimization and correction systems and methods for photolithography systems. Methods include processes for optimizing lens manipulators in order to minimize impact of lens heating on lithographical metrics, particularly where the impact is characterized by a nonlinear relationship to aberration. These methods accommodate nonlinear metrics and can avoid issues associated with from the use of methods that handle nonlinear effects indirectly. Certain embodiments can be employed in systems that involve nonlinear litho metrics, including lens heating models and simulations, applications of lens heating simulations and application specific lens heating control using an image tuner. In some embodiments, the typically non-linear effects of lens heating on CDs may require litho metrics to be a linear function of Zernike polynomials.

Certain embodiments employ a steady state lens heating model comprising a physics-based predictive model. Typically, the model assumes a lens that operates in saturation with maximum field size and numerical aperture. The model is often slit position dependent.

Certain embodiments utilize a dynamic lens heating model that can be characterized as a physics-based predictive model. The dynamic lens heating model can characterize real-time dynamic lens behavior and may be configured to support flexible field sizes and numerical aperture. Reticles can be asymmetric. The model is flexible and configurable and can be extended to describe different lens configurations and combinations.

Certain embodiments provide a lens heating verification tool with lithography manufacturability checking ("LMC"). LMC typically comprises a high accuracy, high speed, high capacity, 100% coverage OPC verification tool.

Certain embodiments incorporate lens heating modeling full-chip lithography simulation systems. Full-chip verification can be applied to identify lens heating induced hot spots and verify lens heating corrections and lens heating aware OPC can be used to mitigate the lens heating impact on image quality.

BRIEF DESCRIPTION OF THE DRAWINGS

FIGS. 16a-16c illustrate the formation of a process window using two dimensional Zernike space.

DETAILED DESCRIPTION OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the components referred to herein by way of illustration.

Figure 1:
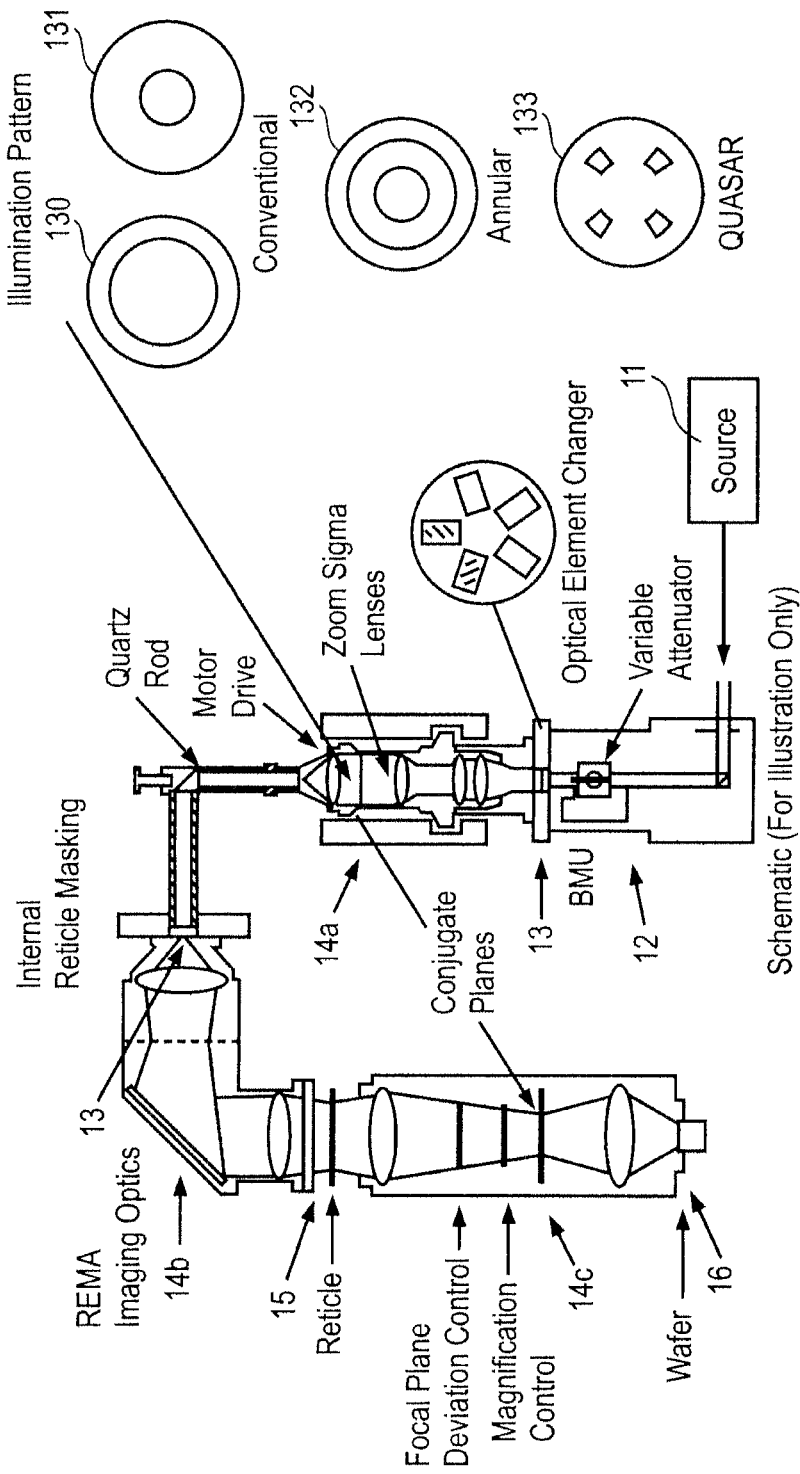
FIG. 1 an example of a lithographic projection system.

FIG. 1 illustrates one example of a lithographic projection system (also referred to as a lithographic exposure apparatus or photolithographic system) 10. The major components include a light source 11, which may be a deep-ultraviolet excimer laser source, illumination optics 12 which define the partial coherence, denoted as a (sigma), and which may include specific source shaping optics 13, 14a and 14b; a mask or reticle 15; and projection optics (also referred to as projection system or lens) 14c that produce an image of the reticle pattern on wafer plane 16. An adjustable filter or aperture at the pupil plane may restrict the range of beam angles that impinge on the wafer plane 16, where the largest possible angle defines the numerical aperture of the projection optics $NA=\sin(\theta_{max})$. Source shaping optics can include an illumination pattern element 130-133 selected to control illumination of reticle 15. For example, the illumination pattern may be produced by conventional elements 130 and 131 selected to control the amount of light passed to the reticle 15, by an annular element 132 or by specialized elements such as a QUASAR element 133.

Figure 2:
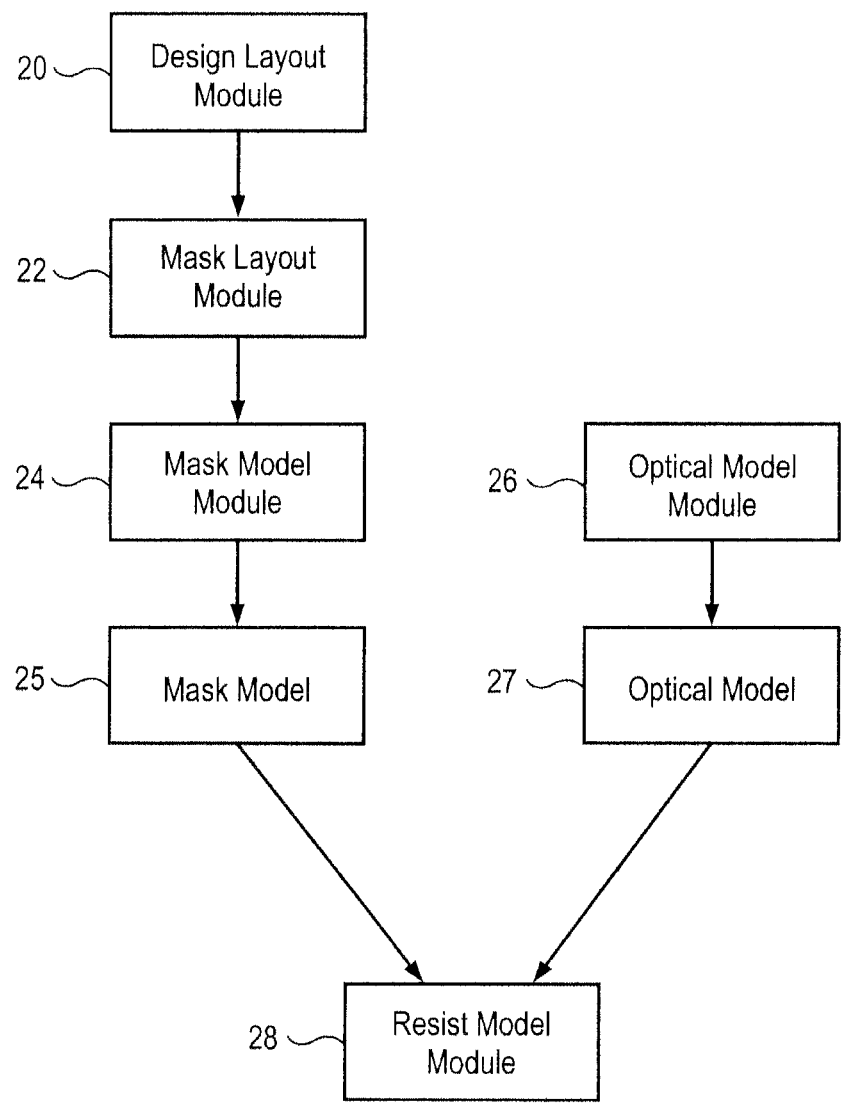
FIG. 2 depicts functional modules of a lithographic projection system.

When simulating the process in the lithographic exposure apparatus, these major system components can be described by separate functional modules as illustrated in the example of FIG. 2. Referring to FIG. 2, functional modules include the design layout module 20, which defines the target design; the mask layout module 22, which defines the mask to be utilized in imaging process, the mask model module 24, which defines the model of the mask layout 25 to be utilized during the simulation process, the optical model module 26, which defines the performance of the optical components of the photolithographic system and the resist model module 28, which defines the performance of the resist being utilized in the given process. As is known to the skilled person, the result of the simulation process produces, for example, predicted contours and CDs in the result module 36.

The properties of the illumination and projection optics are typically captured in optical model 27 that includes NA-sigma settings as well as any particular illumination source shape. The optical properties of the photo-resist layer coated on a substrate—i.e. refractive index, film thickness, propagation and polarization effects—may also be captured as part of the optical model 37. The mask model 25 captures the design features of the reticle and may also include a representation of detailed physical properties of the mask, as described, for example, in U.S. Patent Application No. 60/719,837. The resist model 28 describes the effects of chemical processes which occur during resist exposure, PEB and development, in order to predict, for example, contours of resist features formed on the substrate wafer. An objective of the simulation is to accurately predict edge placements, CDs, etc., which can then be compared against a target design. The target design, is generally defined as a pre-OPC mask layout, and will typically be provided in a standardized digital file format such as GDSII or OASIS.

Aspects of the present invention advantageously model the performance of the projection system (also referred to as lens) used in photolithographic systems and methods. Systems and methods described below can be used to optimize the performance of photolithographic systems by accommodating variations in lens function during operation. Radiation incident on the projection system is typically partially transmitted through the designed radiation path. In an embodiment, light is used as radiation and the radiation path is referred to as a light path. A portion of the incident light may be reflected or refracted away from the light path and a further portion of the incident light may be absorbed by the lens system. Heat energy converted from the incident light will typically be retained in the lens, which is generally a poor heat conductor, and lens heating can cause expansion of the lens which may affect the optical properties of the lens. The effect of lens heating is frequently non-uniform because of the variations in cross-sectional area of the lens that cause some parts of the lens to generate and retain greater quantities of heat than other parts of the lens. Thus, non-uniform heating of lens portions can result in local changes to the refractive index of the lens resulting in modified optical paths and aberrations detectable in the patterns produced in a photo-resist.

Furthermore, systems that employ diffraction optical elements (e.g. pupil elements) to selectively illuminate parts of the lens create areas of the lens that receive relatively high intensity light while other areas receive little or no light and resultant heating (see, e.g. the Quasar illumination pattern 133 depicted in FIG. 1). Thus, differences in lens heating can create significant temperature gradients within a lens that affect the optical properties of the lens proportionate to the local temperature and the structure of the lens and illumination patterns. Changes in lens function may be reduced or substantially eliminated in some scanners through the use of lens manipulators configured to apply and/or relieve pressure on selected areas and/or points of the lens that offsets or negates the effect of lens heating. These manipulators can minimize aberration and control other user-specified litho metrics such as CD variations caused by lens heating. Certain embodiments provide models that include characterizations of corrective systems used to ameliorate lens heating induced aberrations in order to reduce printing defects on wafers. Therefore, it is contemplated that aspects of the present invention can be included in optimization and correction systems and methods that comprise models, simulations and applications that characterize lens heating effects and control of manipulators and other corrective systems.

Examples of correction systems include manipulators used to squeeze the lens to achieve a counteractive distortion of the portions of the lens affected by heating. Models provided according to certain aspects of the invention account for manipulator movement calculated to counteract changes in refractive index. For the purpose of this description, it will be assumed that pressure applied to the lens has a linear effect on aberrations caused by lens heating. It is contemplated that some systems and methods will use models in which non-linear effects of pressure to the lens are identified. Moreover, it is contemplated that uniformity of heating may be approximated by appropriate design and use of optical elements and masks whereby, for example, different optical elements can be used which pass light to different portions of the lens for different portions of the masks. In such systems, the model may be adjusted accordingly.

Certain embodiments employ heating models to reduce aberration effects by calculating CDs as a function of lens changes. Typically, a linear relationship between lens changes and CDs is preferred because with a linear relationship the least squares criteria can be easily applied. Applying the least squares criteria for linear relationship is fast (i.e. high processing speed) and therefore enables real-time control of the photolithographic process. However, the relationship between CD and lens heating is typically non-linear and, in some applications, the CD relationship is characterized non-linearly while, in other applications, an algorithm may be used to linearize the CD relationship. For reasons of speed and efficiency of processing, the CD relationship is preferably linearized to permit use of the linear model.

In certain embodiments, CDs may be expressed in a non-linear function of Zernike polynomials. Zernike polynomials are useful in expressing wavefront data in polynomial form and Zernike polynomials comprise terms that are similar in form to aberrations associated with optical systems. Generally, Zernike coefficients correspond to the weights of the polynomials. In certain embodiments, Zernike coefficients are numbers representative of a perturbation in the CD. If the Zernike coefficient is zero, there is no perturbation. Typically a second order polynomial can be used to represent aberrations resulting from lens heating and a lithometric-Zernike relationship can be established through simulation and/or measurement of photolithographic images.

Lens manipulators can be used to generate aberration Zernikes in addition to existing Zernikes, including Zernikes associated with lens heating. The behavior may be modeled by a linear relationship:

$$z_i = z_i^* + \sum_j s_{ij} m_j, \text{ where } s_{ij} = \frac{\partial z_i}{\partial m_j}, \quad (1)$$

and where $m_j$ (j=1, 2 ...) are lens manipulators, $z^*_i$ (i=1, 2 ...) are existing Zernikes, $z_i$ (i=1, 2 ...) are total Zernikes, and $s_{ij}$ are sensitivities of the Zernikes z to the lens manipulators m. For a given lithography process, CD variations caused by lens aberrations can be expressed as a function of aberration Zernikes which can be approximated by a quadratic function:

$$\Delta CD = \sum_i b_i z_i + \sum_{ij} a_{ij} z_i z_j. \quad (2)$$

wherein $b_i$ and $a_{ij}$ are CD variation coefficients. Substituting equation (1), the relationship between CD variations and lens manipulators may be written as:

$$\Delta CD = \Delta CD^* + \sum_i \beta_i m_i + \sum_{ij} \alpha_{ij} m_i m_j. \quad (3)$$

Given an objective of controlling the lens such that CD variations lie within predefined control limits (e.g., 10% of target CD variations), then $$|\Delta CD_k| \leq CL_k, \quad (4)$$

where k (k=1, 2, 3 ...) denotes a set of critical locations or hotspots at which the CDs are measured. This can be formulated as an optimization problem of the following cost function:

$$G = \max\left(\frac{|\Delta CD_1|}{CL_1}, \frac{|\Delta CD_2|}{CL_2}, \frac{|\Delta CD_3|}{CL_3} \ldots \right), \quad (5)$$

in which the goal is to minimize G in manipulator space M.

The latter optimization problem may be solved using methods such as simulated annealing, a genetic algorithm and the like. Although these methods are deemed global, they tend to be slow and the solution may be far away from the origin of M=0, where the linear relationship between the total Zernikes $z_i$ and the lens manipulators $m_i$ may be invalid. Consequently, certain embodiments of the invention use an alternative cost function to provide a faster, location minimum solution around the origin. The alternative cost function may be formulated as follows:

$$G = \sum_k \left(\frac{\Delta CD_k}{CL_k}\right)^q, \quad (6)$$

where q is typically a large even number selected to mimic the behavior of equation (5). This formulation allows the gradient to be calculated analytically and enables fast methods such as steepest descent method, conjugate gradient method, etc.

When the tuning amount defined by lens manipulator settings is significant, it is likely that the coefficients in equation (3) can change from their reference states. Therefore, upon reaching the minimum location of the cost function, the coefficients may need to be recomputed at the new state before performing another iteration of the procedure for minimizing the cost function. Plural iterations may be required to obtain convergence.

In certain embodiments other lithographic process parameters—including, for example, focus and dose—may be optimized for lens heating by including them as part of the variables in equation (3). Optimized lens manipulator parameters may be wrapped into a virtual litho metric with a large weight and fed into an existing tuning system to force the manipulators to be set to the intended state.

Certain aspects of the invention will now be described with reference to FIGS. 16a-16c (see also FIG. 13). FIG. 16a depicts a two dimensional Zernike space. It will be appreciated that embodiments of the invention are not restricted to a two dimensional Zernike space and that the use of two dimensional space merely simplifies illustration of certain aspects of the invention. As a first step, a lithometric function $L_\alpha$ may be established as function of Zernike polynomials such that:

$$L_\alpha = f(Z_i) \alpha = 1, 2Kn \quad (7)$$

Thus, for a set of CDs ($CD_1 \ldots CD_n$) printed from a selected mask:

$$L_\alpha = f(Z_1, Z_2 K Z_n). \quad (8)$$

Objectives of the optimization process include controlling the effects of lens heating such that $|\Delta L_\alpha| < CL_\alpha$, wherein $CL_\alpha$ represents a maximally acceptable value of the lithometric function. FIG. 16b is a graph plotting each of a plurality of $Z_i$ curves for one example. FIG. 16c shows the result of linearization in one curve where the result for all CDs is approximated to the form of an ellipse having principal axes P1 and P2 and whereby the principal axes for each Zernike result is linearized:

$$PA_B = f(Z_1 K Z_i). \quad (9)$$

Thus, an ellipse is obtained that covers all CDs and linearization can be obtained by determining the principal axes of the ellipse.

A cost function for the polynomial in equation (8) may be established as:

$$\text{Cost} = \sum_\alpha \left|\frac{L_\alpha}{CL_\alpha}\right|^\beta, \quad (10)$$

where the lithometric function $L_\alpha$ is a function of all Zernikes. This cost function Cost may be minimized using an optimization algorithm. Preferably, the Zernikes can be reduced to an expression in the form of Z=f(M), where M is a set comprising one or more manipulator settings (i.e. a plurality of manipulator settings). Consequently, the cost function Cost becomes a function of the plurality of manipulator settings·M.

In certain embodiments, the lithometric function $L_\alpha$ is linearized before optimization is attempted. However, nonlinear effects can be handled using alternative methodologies for controlling optimal lens manipulator settings that may include an assumption of no limitations in the photolithographic process. These methodologies can include analyzing the structure of the Zernike subspace reachable by lens manipulator tuning, analyzing the structure of hotspots, determining a cost function and subsequently minimizing the cost function.

With regard to the structure of the Zernike subspace, a physical model of a lens manipulator may be used that includes Zernikes that are linearly dependent on the lens manipulator setting, whereby sensitivity is independent of the current lens state. In one example, where there are n Zernikes and m lens manipulators and m<n, the Zernike state that can be achieved from any raw hot lens state $\{Z_h\}=\{Z_{1h}, Z_{2h}, \ldots Z_{nh}\}$ by tuning lens manipulators can be expressed as:

$$Z_k = Z_{kh} + \sum_j (S_{kj} * M_j) \quad (11)$$

where $Z_k$ is the after-tuning value of $k^{th}$ Zernike, $Z_{kh}$ is the raw hot lens value of $k^{th}$ Zernike, $M_j$ is the setting of the $j^{th}$ lens manipulator, $S_{kj}$ is the sensitivity of the $k^{th}$ Zernike to the $j^{th}$ lens manipulator. $S_{kj}=dZ_k/dM_j$. As used herein, "raw hot lens" means a lens to which no correction is applied by lens manipulators; i.e., all lens manipulator settings are set at 0. Writing (11) in a matrix form:

$$\{Z\}=\{Z_h\}+\{S\}*\{M\} \quad (12)$$

where $\{Z\}$ and $\{Z_h\}$ are n-dimensional vectors, $\{S\}$ is an n-by-m matrix and $\{M\}$ is an m-dimensional vector.

It can thus be said that the n-dimensional vector $\{Z\}$ obtainable by tuning lens manipulators describes an m-dimensional subspace, which passes through the point $\{Z_h\}$ and is expanded by the m column-vectors of $\{S\}$. The lens manipulator setting $\{M\}$ represent the expansion coefficients. With regard to the analysis of the structure of hotspots, it will be assumed here that X hotspots have been identified and are defined as CD variations requiring compensation to fit within a range:

$$|(CD_x - CD_{x0})| \leq CDC_x; \quad (13)$$

i.e., the absolute deviation of $CD_x$ from its target $CD_{x0}$ must not exceed $CDC_x$. Using equation (12), and assuming that $\{S\}$ is known or is extractable from photolithographic system configuration or programming, then an analytical form can be computed as a polynomial expansion of the dependence of each CD on lens manipulator settings, commencing with a raw hot lens state. Using a 2nd order approximation:

$$CD_x(M_1KM_m) = CD_{xh} + \sum_i (ax_i * M_i) + \sum_{ij} (bx_{ij} * M_i * M_j) \quad (14)$$

where: $CD_{xh}$ is the $CD_x$ value at raw hot lens, $ax_i$ and $bx_{ij}$ are the coefficients computed for $CD_x$ and x lies between 1 and X. Equation (14) maps out the CD variation within the Zernike subspace reachable by tuning the lens manipulators.

A cost function can be generated and minimized. The objectives of lens manipulator optimization typically include minimizing the maximum deviation of each $CD_x$ from its corresponding control target:

$$\min\left\{\max_x \left|\frac{(CD_x - CD_{x0})}{CDC_x}\right|\right\} \quad (15)$$

A cost function F can be defined:

$$F(M_1KM_m) = \max_x \left|\frac{(CD_x - CD_{x0})}{CDC_x}\right| \quad (16)$$

This max-abs cost function can be difficult to minimize because of the non-existence of its derivative and, as an alternative, certain embodiments modify the cost function as follows:

$$F(M_1KM_m) = \sum_x \left[\frac{(CD_x - CD_{x0})}{CDC_x}\right]^4 \quad (17)$$

The fourth power is used in the example represented by equation (17) to approximate the max-abs function. The power may be selected arbitrarily and/or based on the nature of the lens, reticle design, past experience, attributes of the photolithographic process and intuition.

The derivative of cost function F for each lens manipulator can be analytically computed by substituting equation (14) into equation (17). The resultant equation can then be minimized using a nonlinear minimization method such as the "steepest descent" method to minimize the cost functions F.

In the example described above certain coefficients $ax_i$ and $bx_{ij}$ are assumed to remain constant regardless of lens manipulator current settings. In reality, it is likely that the value of such coefficients at the raw hot lens state is not representative for the parameters they represent when the tuning amount is significant. Therefore, when the minimum location of the cost function F is reached, it may be necessary to recompute equation (14) at the Zernikes for the minimum-F location. Another iteration of the procedure may be performed to minimize the cost function F, until convergence is achieved.

In certain embodiments focus F and exposure dose E can be optimized for lens heating. In the example described above, no special assumptions were made for the lens manipulators except that a hotspot CD can be expressed as a second order polynomial of lens manipulator setting. However, the polynomial expansion can further include process window variables focus F and exposure dose E. In fact, in the formulation, it can be assumed that $F=M_m+1$ and $E=M_m+2$ such that focus and exposure can be treated as two additional lens manipulators. Therefore, focus F and exposure dose E can be included as part of the optimization process without any change to the algorithm, except for the addition of two further dimensions in the reachable subspace.

Figure 3:
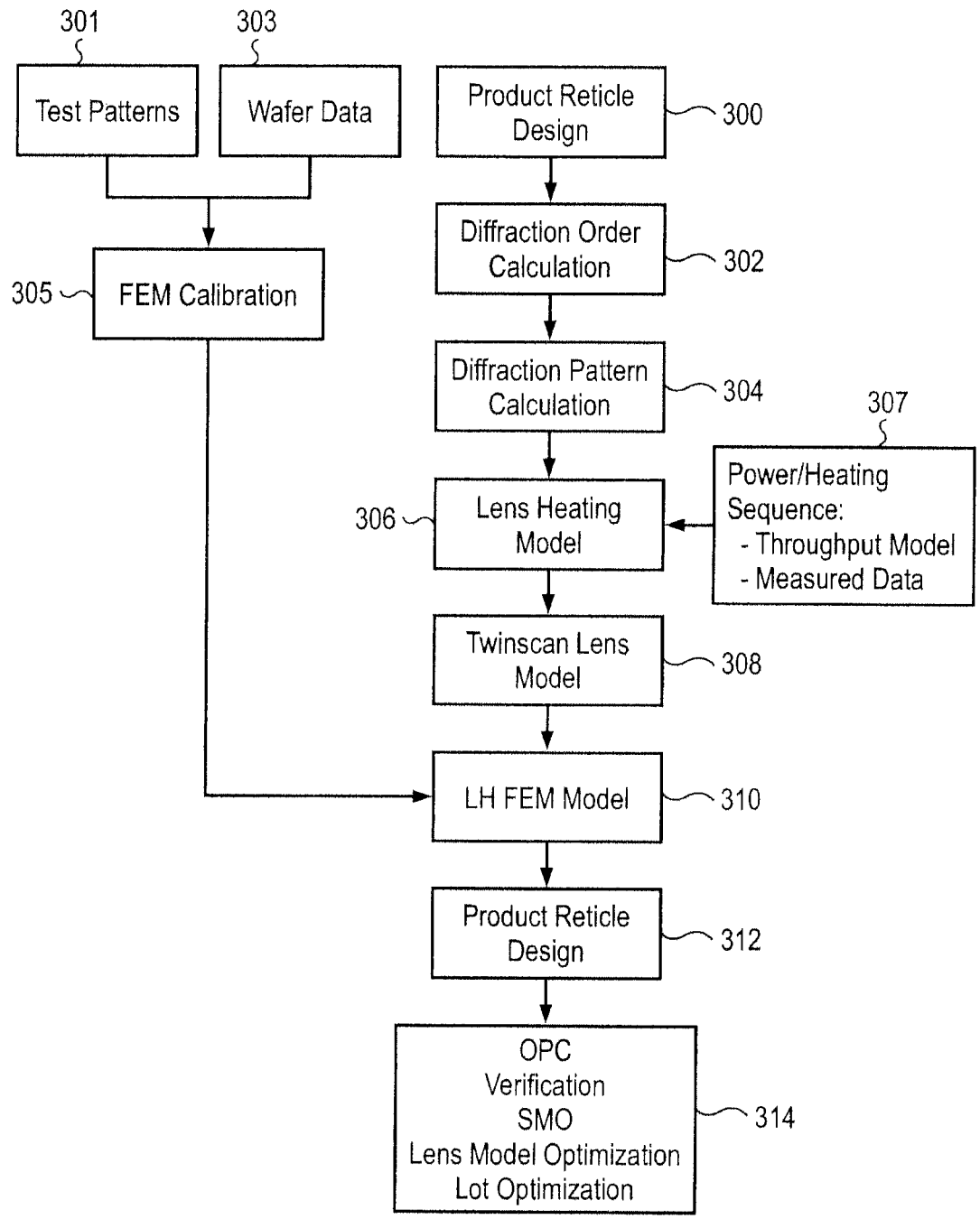
FIG. 3 shows a lithographic process according to certain aspects of the invention.

FIG. 3 depicts one example of a lithographic process according to certain aspects of the invention. Generally, the depicted system describes the use of a model calibrated to data collected from a lens; the data is typically collected while the lens is in a cold state. The model can then be combined with additional data to obtain a predictive model that can be used without calibration while the lens is in a heated state.

Commencing with a product reticle design 302 and, where appropriate, other product-specific information, a diffraction order calculation 302 and diffraction pattern calculation 304 are performed. A lens model 306 is obtained while the lens is cold. The lens model typically characterizes sequences of power and heating 307 in order to obtain throughput models. The lens heating models may be validated using measurements obtained through testing and production results. A twin scan model 308, described in more detail below, can then be generated and combined to obtain a Lens Heating Focus Exposure Matrix (LH FEM) model 310 M(f,e,x,y) that is based in part on a Focus Exposure Matrix calibration 305 M(f,e) obtained from test patterns 301 and wafer data 303. The LH FEM model 310 is then used for product design 312 used in a plurality of applications 314 including Optical Proximity Correction (OP C), verification, Source Mask Optimization (SMO), Lens Model optimization and lot optimization applications (wherein a lot is a group of substrates to be exposed in the photolithographic process).

Figure 4:
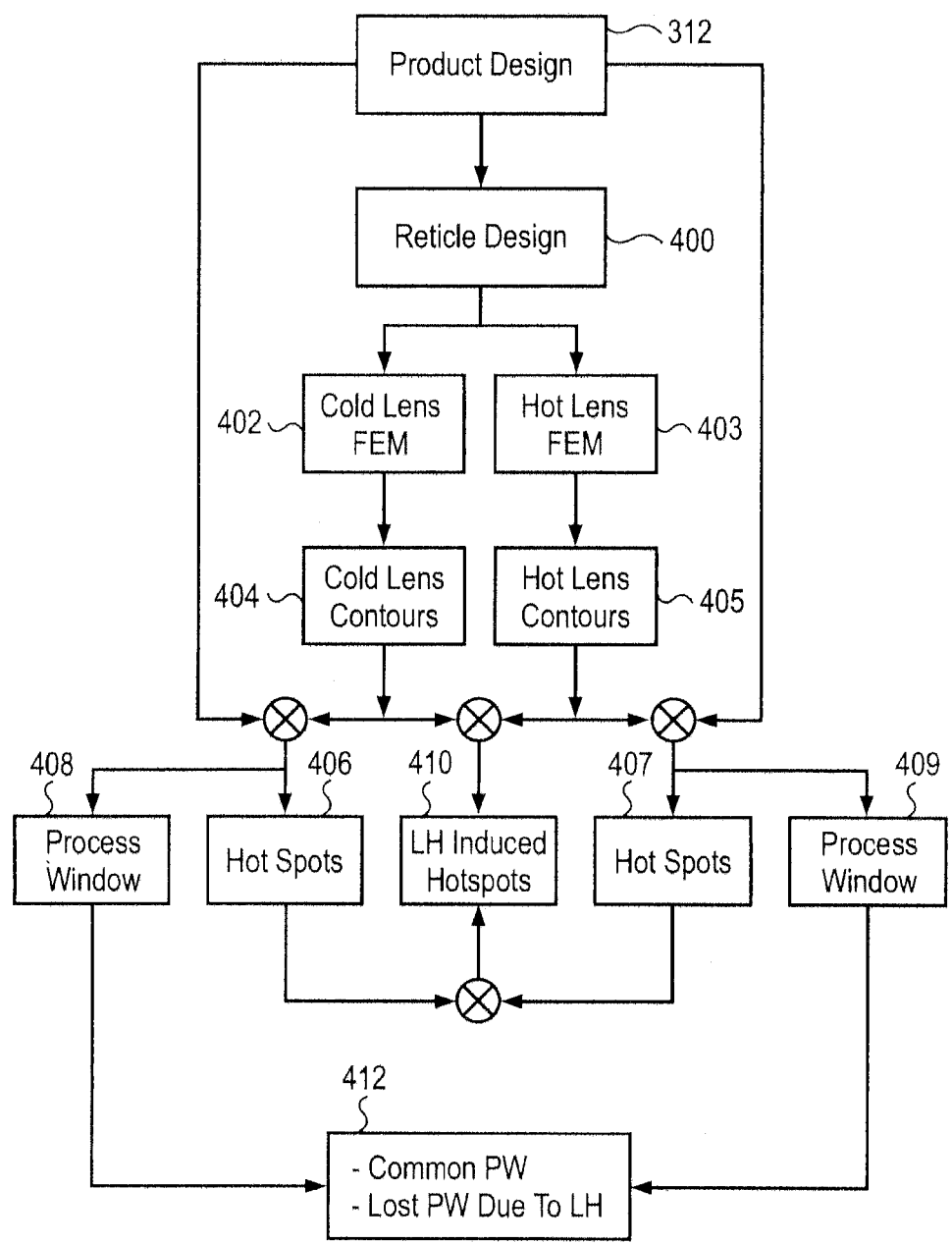
FIG. 4 describes an application of a model calibrated to data collected from a lens.

FIG. 4 depicts elements in one example of a product reticle design 312 according to certain aspects of the invention. Generally, the depicted system describes the use of a model calibrated to data collected from a lens; the data is typically collected while the lens is in a cold state. The model is then combined with additional data to obtain a predictive model that is used without calibration while the lens is in a heated state.

Commencing with a reticle design 400 and, where appropriate, other product-specific information, a diffraction order and diffraction pattern calculations are performed. A lens model 402 is obtained while the lens is cold and one or more other lens models 403 are obtained after the lens has been heated through use. The lens models 402 and 403 typically characterize sequences of power and heating in order to obtain throughput models. The lens models 402 and 403 are validated using measurements obtained through testing and production results.

The cold 402 and hot 403 lens models can be used to generate corresponding cold lens contours 404 and hot lens contours 405. These contours may then be analyzed for hot spots 406 using a cold lens and hot spots 407 using a hot lens. The differences in hotspots may be determined as lens heating induced hotspots 410 and these differences can be used to characterize performance of the lens over a given temperature cycle. A cold lens process window 408 may be mapped based on hot spots 406 for one or more reticles and a hot lens process window 409 may be mapped based on hot spots 407 for the same one or more reticles. These process windows 408 and 409 may then be combined 412 to delineate the combined process window covering hot and cold lens operation. At the same time loss of process window may be measured to identify performance enhancements that may be obtained if the state of heating of the lens is changed.

Figure 5:
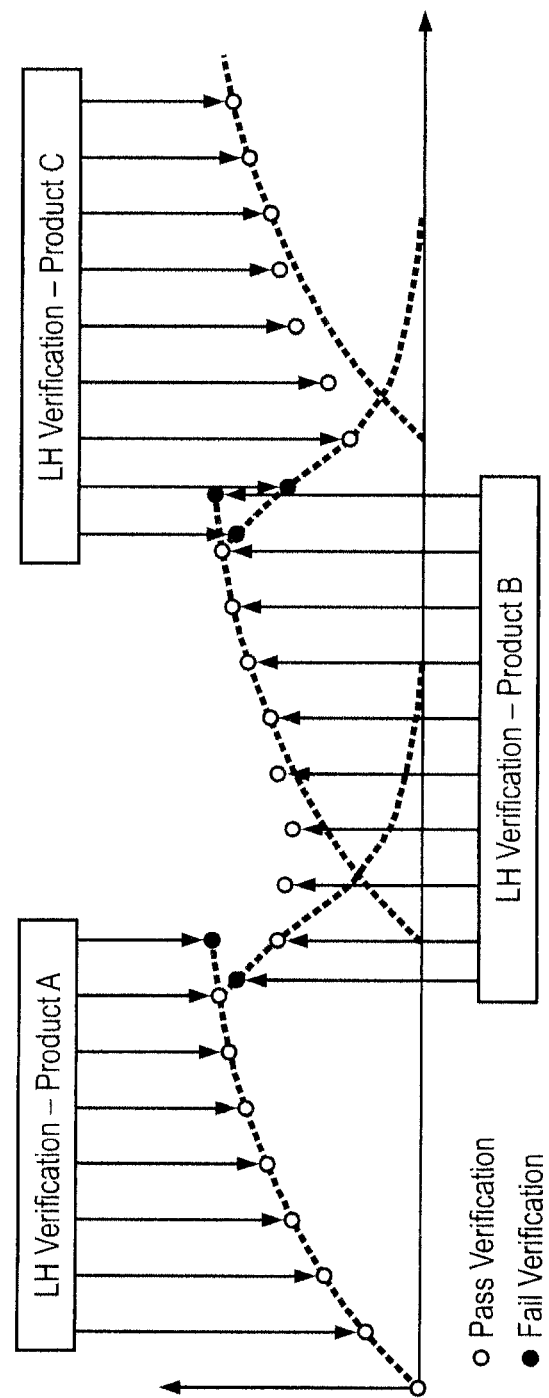
FIG. 5 illustrates lot optimization using a lens heating verification process.

Lot Optimization is illustrated in FIG. 5. Heating and cooling sequences can be simulated with multiple verification jobs. A typical process includes determining a safe number of lots by verifying against a preset metric using process window, CDU, etc., and determining a best choice for the next design/illumination after previous run and calculating any required delay. Certain embodiments employ an ASCAL or dynamic lens heating model.

Certain embodiments employ a steady state lens heating model comprising a physics-based predictive model. Typically, the model assumes a lens that operates in saturation with maximum field size and numerical aperture. Typically, the model is slit position dependent. In certain embodiments, an ASCAL-based lens heating model is employed that is based on actual measurements obtained using real patterning devices (such as masks or reticles) on real lithographic exposure apparatuses, for example scanners. This model may be configured to be slit and scan position dependent and is capable of reconstructing dynamic lens behavior.

Certain embodiments utilize a dynamic lens heating model that can be characterized as a physics-based predictive model. The dynamic lens heating model can characterize real-time dynamic lens behavior and may be configured to support flexible field sizes and numerical aperture. The model may accommodate for asymmetric patterning means such as reticles. The model is flexible and configurable and can be extended to describe different lens configurations and combinations.

Figure 6A:
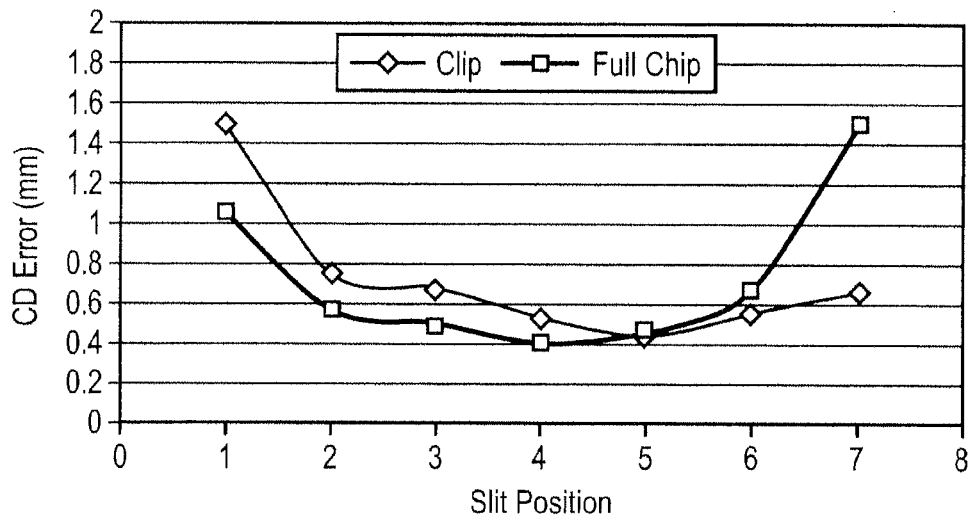
FIGS. 6a-6c illustrate CD error and hot spot variations relationships.
Figure 6B:
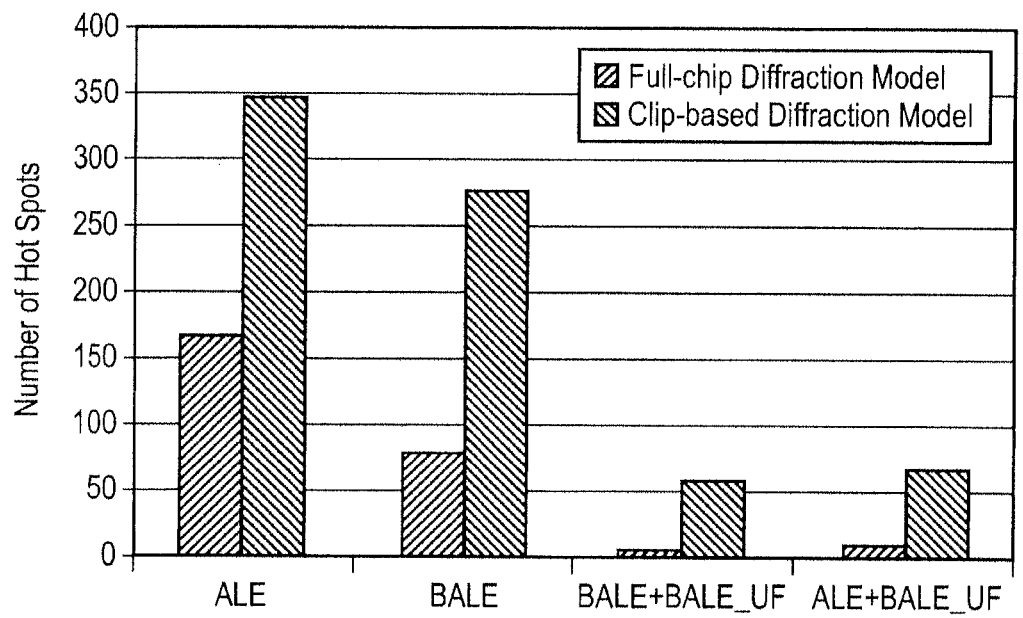
Figure 6C:
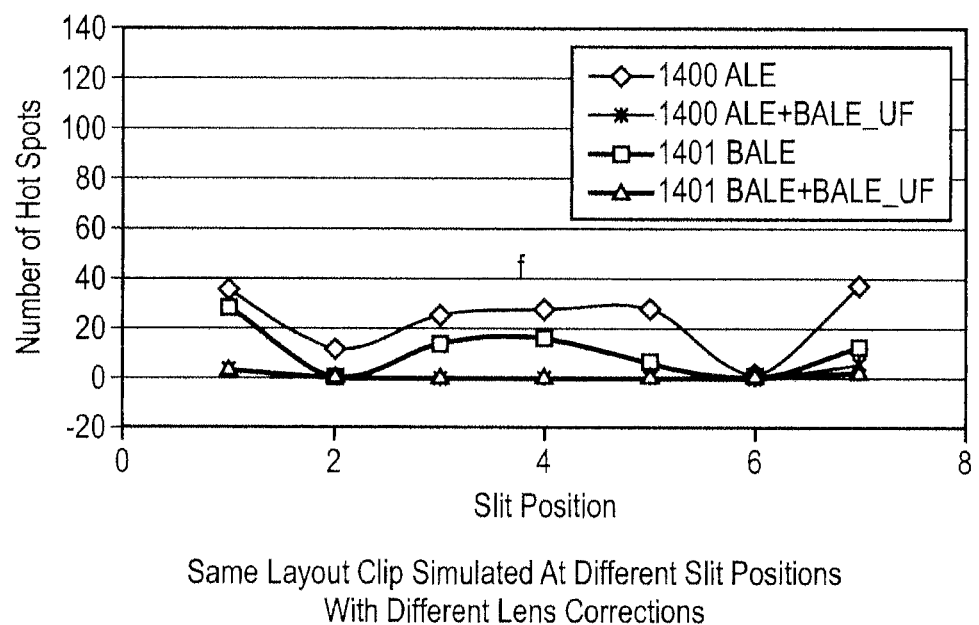

The charts of FIGS. 6a-6c depict the relationship of critical dimension errors to slit position, the differences between clip-based models and full-chip models and the relationship between the number of hotspots observed for different ALE configurations. FIG. 6a shows that, for single dimension patterns, clip-based models experience a difference of up to 1 nm critical dimension (CD) error compared to full-chip model. FIG. 6b shows that, for one- and two-dimension patterns, clip-based models grossly over-predict the number of hot spots compared to a full chip model indicating that it is often preferable to employ a full-chip model.

FIG. 6c is a chart that depicts the effect of lens heating on the number of detected hotspots. The chart is created for the same example of a DRAM device used in FIGS. 6a and 6b with different slit positions and lens corrections. The differences in lens behavior at different slit positions influences operation of certain embodiments of the invention including matching layout patterns with slit positions to avoid over- or under-predicting hot spots. Additionally, because of field dependent effects, flat full-chip analysis may be used for actual product designs because a conventional hierarchical based analysis approach may not be suitable in all instances. Similar cross slit signatures are observed for different lens corrections and these can be worse at edge position compared with the center position. Moreover, simulation of clip design without a known placement may be performed for multiple slit positions and accommodation made for worst case situations. For example, SMO, Design For Manufacturing (DFM) and other techniques may be employed.

Figure 7:
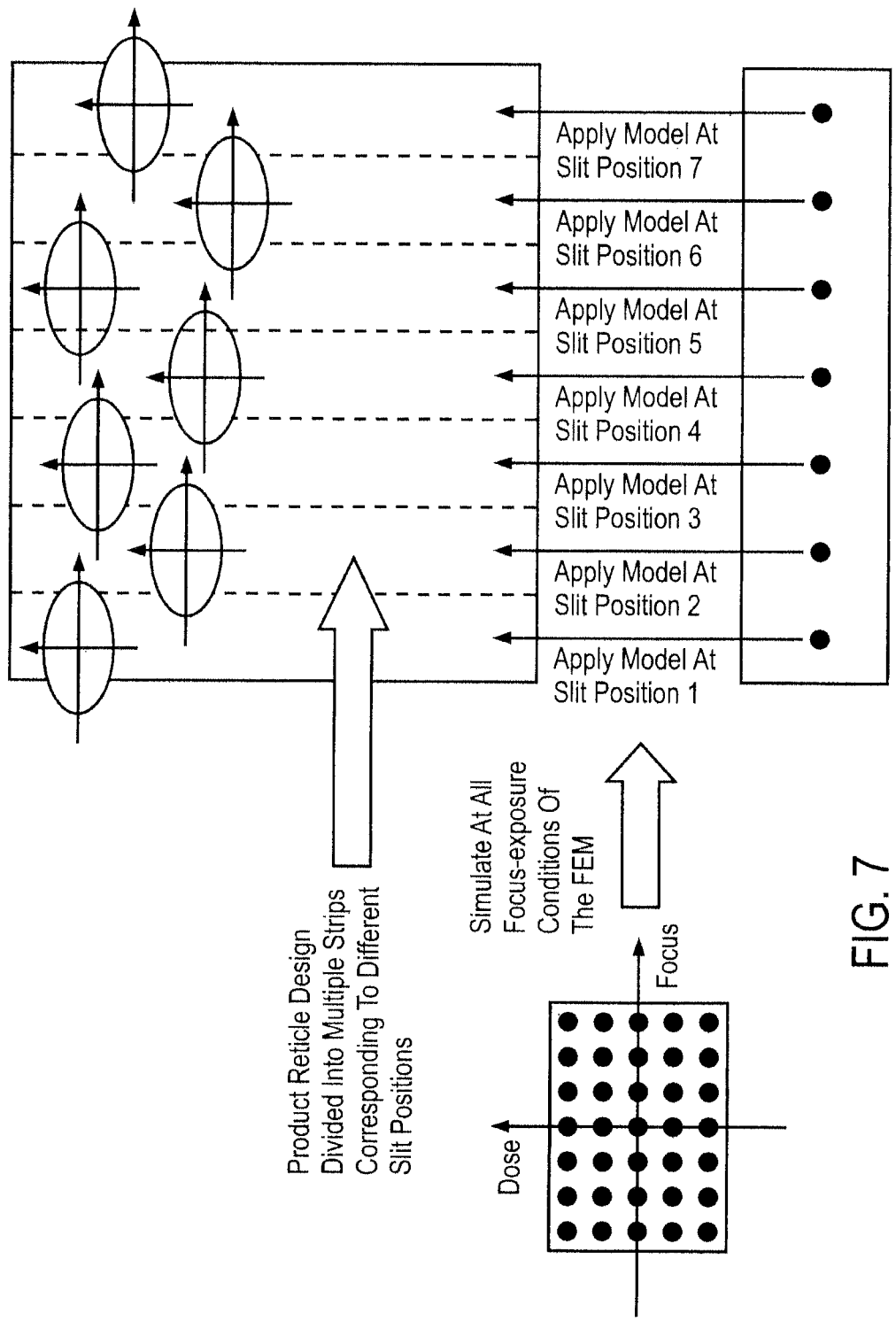
FIG. 7 graphically depicts an example of a lens heating verification process.

FIG. 7 graphically depicts an example of a lens heating verification process useful in providing a full design, full process window through slit simulation. In the flowchart, hot spots comprise patterns that are sensitive to lens heating effects such as patterns that pass cold lens model but fail steady state models and large contour deviations between cold and steady state models. The process windows include overlapping windows of cold and steady state conditions and may be related to different power settings and different illumination and OPC conditions.

Certain embodiments provide a lens heating verification tool with lithography manufacturability checking ("LMC"). LMC typically comprises a high accuracy, high speed, high capacity, 100% coverage OPC verification tool. LMC applies image-based simulation on full chip design throughout the process window, identifies common catastrophic or yield limiting hot spots such as bridging, necking, CD uniformity error, and multi-layer overlays error and quantifies the total process window. The use of a lens heating model allows LMC to locate hot spots by scanning through an entire layout, quantify process window impact due to lens heating effect, and verify corrective measures against such effects.

Figure 8:
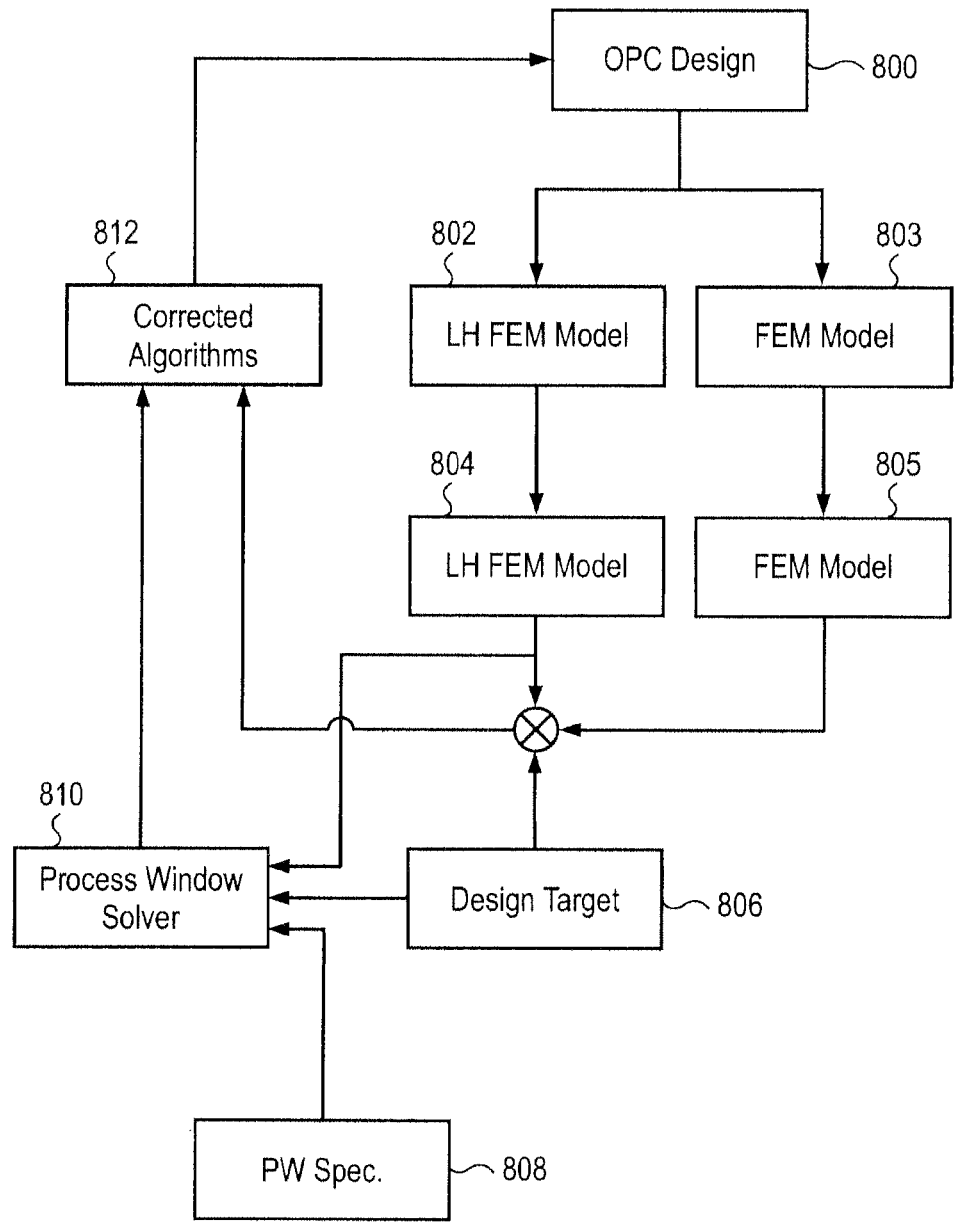
FIG. 8 is a block diagram showing an example of a lens heating aware OPC

FIG. 8 is a block diagram showing an example of a lens heating aware OPC which can operate as a high accuracy, high speed OPC correction tool and which provides dense sampling for best CD uniformity control. A process window solver 810 allows multiple models 804, 805 and process window conditions 808 to guard against catastrophic failures off nominal conditions 806. In certain embodiments, the OPC may comprise a lens heating model (OPC+) 802 that can account for lens heating effect by applying the steady state models together with cold lens models 803 in other OPC systems. In certain embodiments, OPC are simultaneously optimized for cold and hot lens states across slit across process window and a process window solver can be applied for multiple slit and multiple process window conditions to remove catastrophic pattern failures such as bridging and necking. The process solver window 810 can operate to regulate correction algorithms 812 in order to remove PW failures. Correction algorithms 812 can adjust edges to drive down edge placement errors (EPE).

Figure 9:
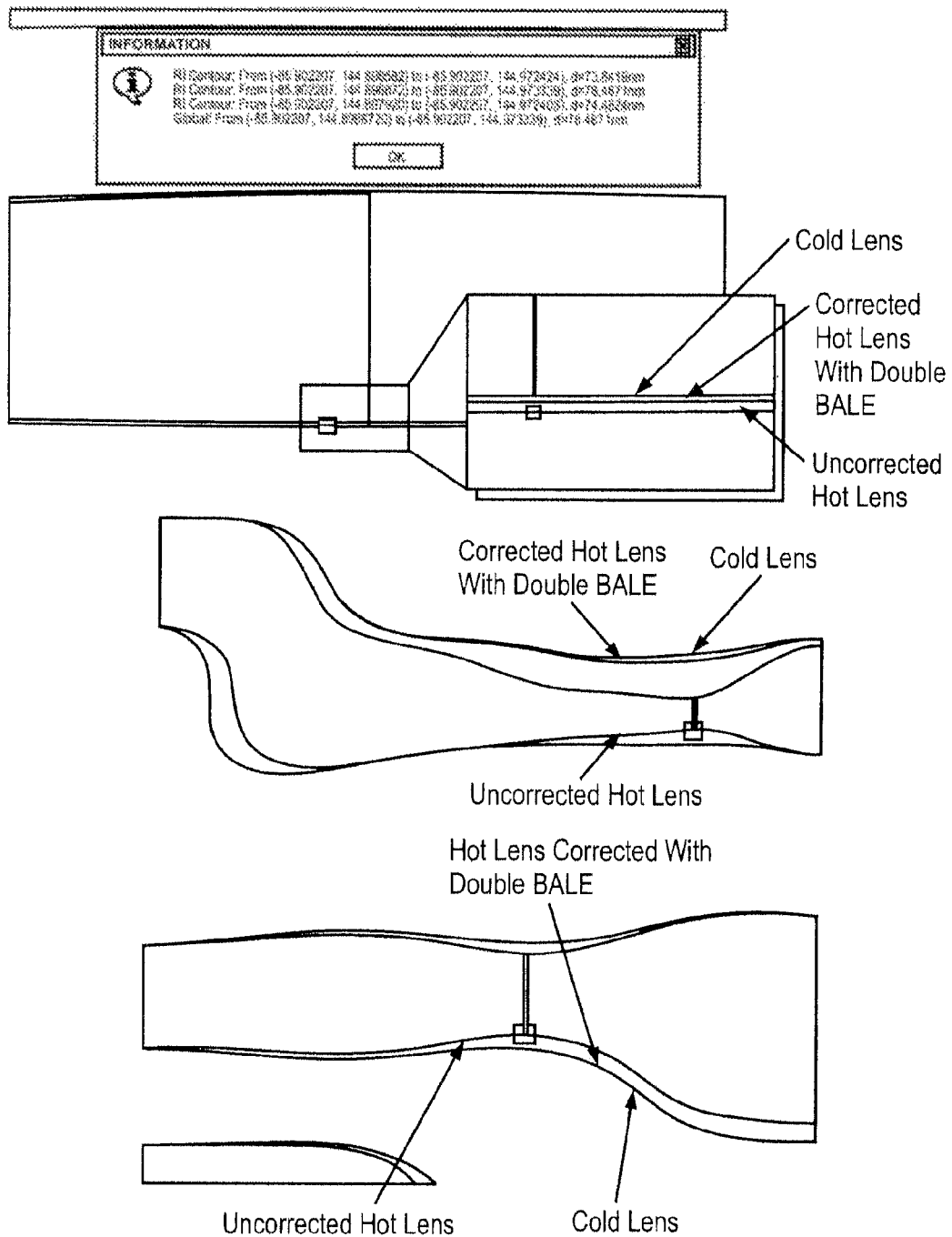
FIG. 9 illustrates cross slit necking improvement with lens heating aware OPC.
Figure 10:
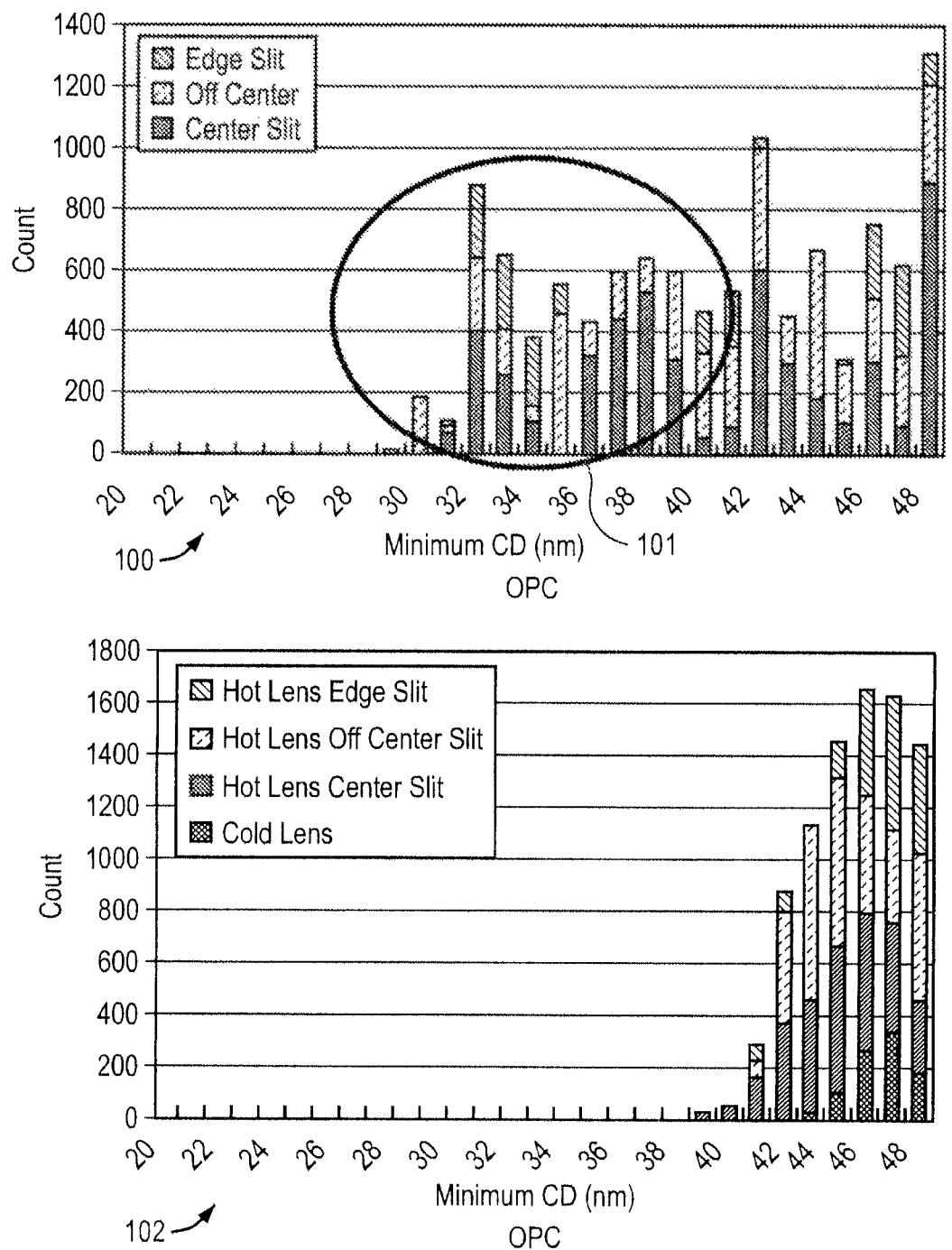
FIG. 10 compares necking in processes with and without lens heating awareness.
Figure 14:
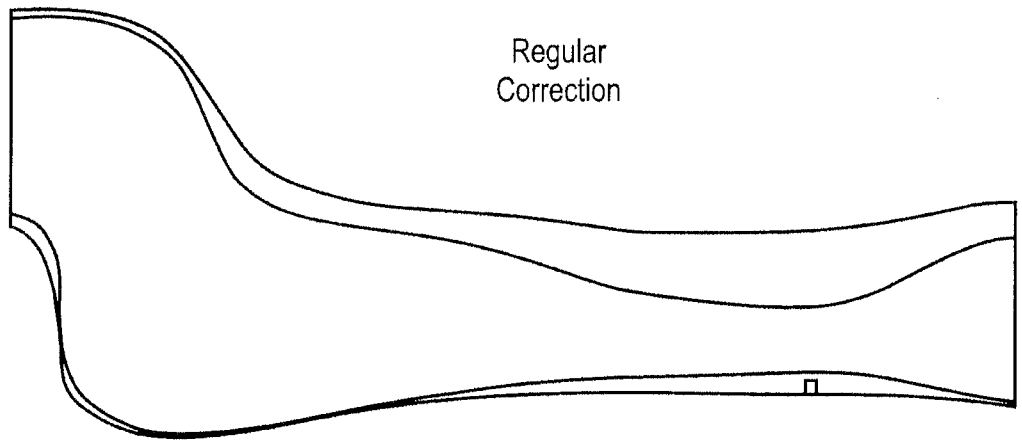
FIG. 14 illustrates results that can be obtained using systems and methods according to certain aspects of the invention.
Figure 14:
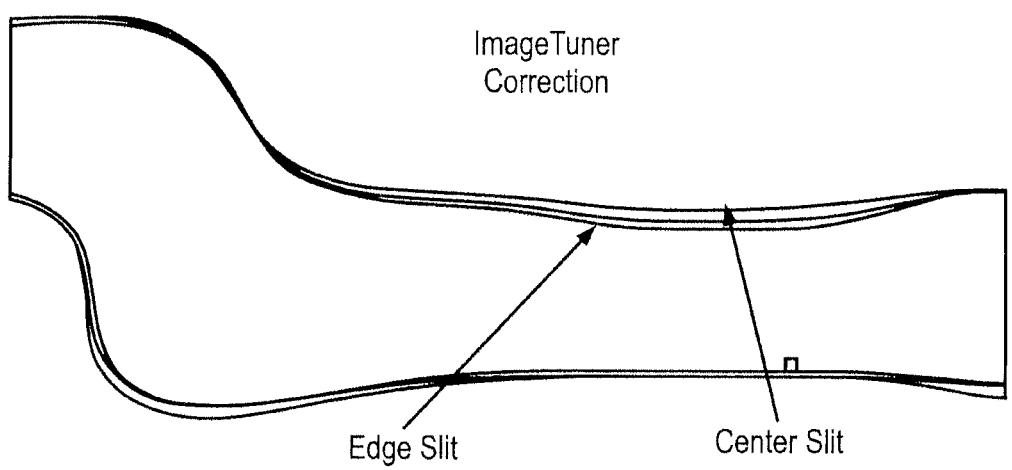
Figure 15:
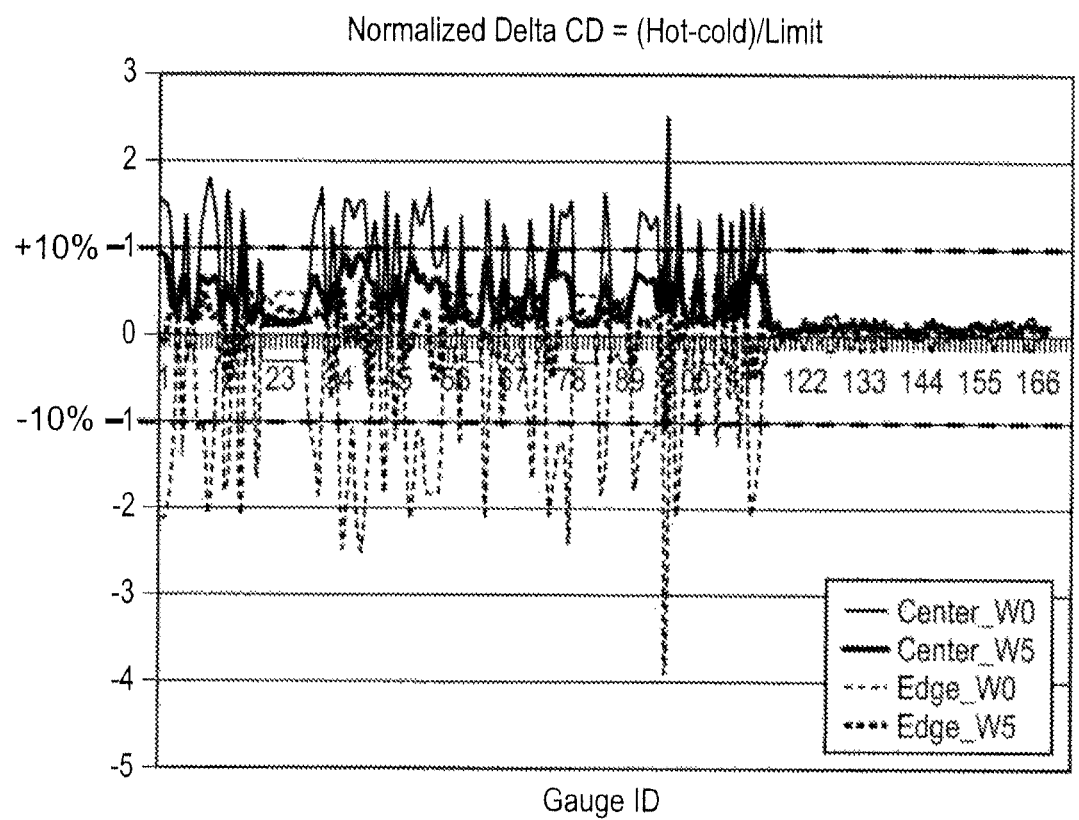
FIG. 15 is a graphically depicts CDU improvement in certain embodiments of the invention.

FIG. 9 shows examples of hot spots obtained from simulation that shows results obtained using an uncorrected lens superimposed on corresponding results obtained using a corrected lens. FIGS. 14 and 15 illustrate results that can be obtained using systems and methods according to certain aspects of the invention. In particular, FIG. 15 shows a 200%-300% improvement in CDU over conventional lens models. In FIG. 10, results 100 obtained from an OPC system without lens heating awareness show the occurrence of necking (circled) 101 while results 102 from a lens heating aware embodiment is notable for the absence of necking. In the former case, the OPC is optimized for cold lens state and can create necking problems at hot lens state at all slit positions, while in the latter case, lens heating aware OPC does not generate the same necking problems at both cold and hot lens states for all slit positions.

Figure 11:
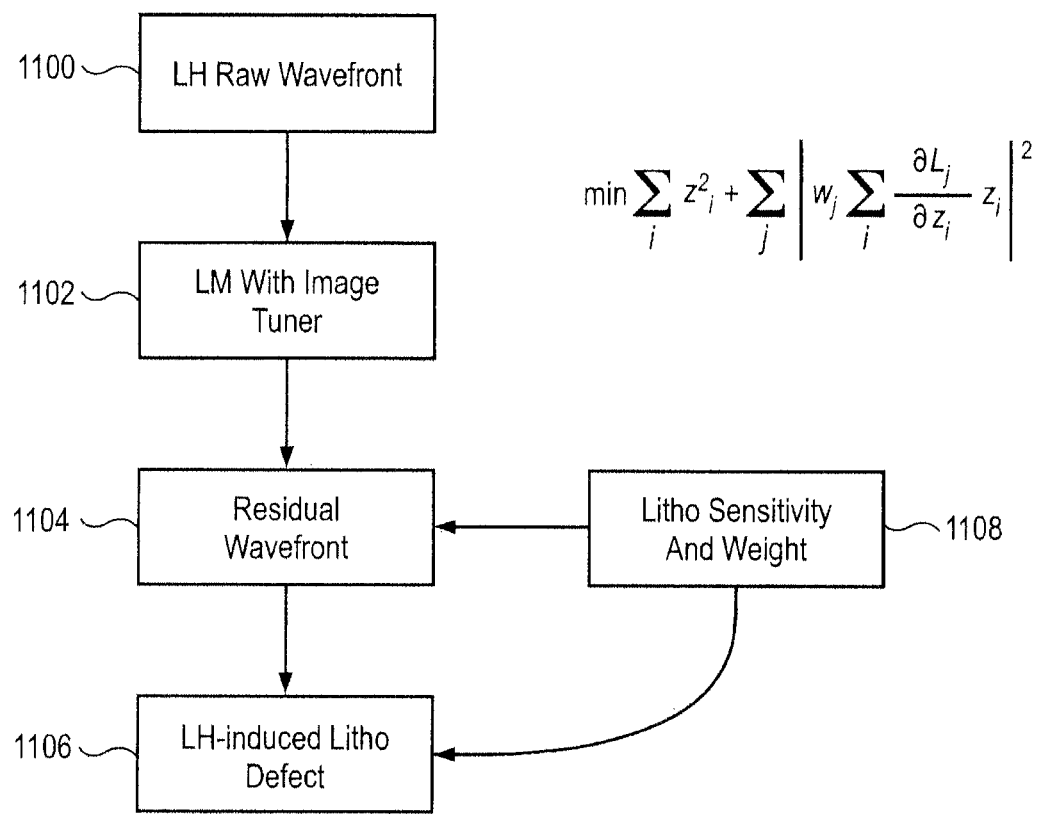
FIG. 11 describes principles of operation of application specific lens heating controls.

Turning now to FIG. 11, the principles of operation of application specific lens heating controls will be described. The image tuner 1102 can account for litho metrics as part of lens manipulator optimization, thereby producing a better solution for reducing litho defects. A lens model without image tuner can minimize residual wave fronts 1104 but the results obtained may not represent the optimal solution for minimizing aberration-induced litho defects 1106, unless aberration can be minimized 1108 until practically non-existent.

Figure 12:
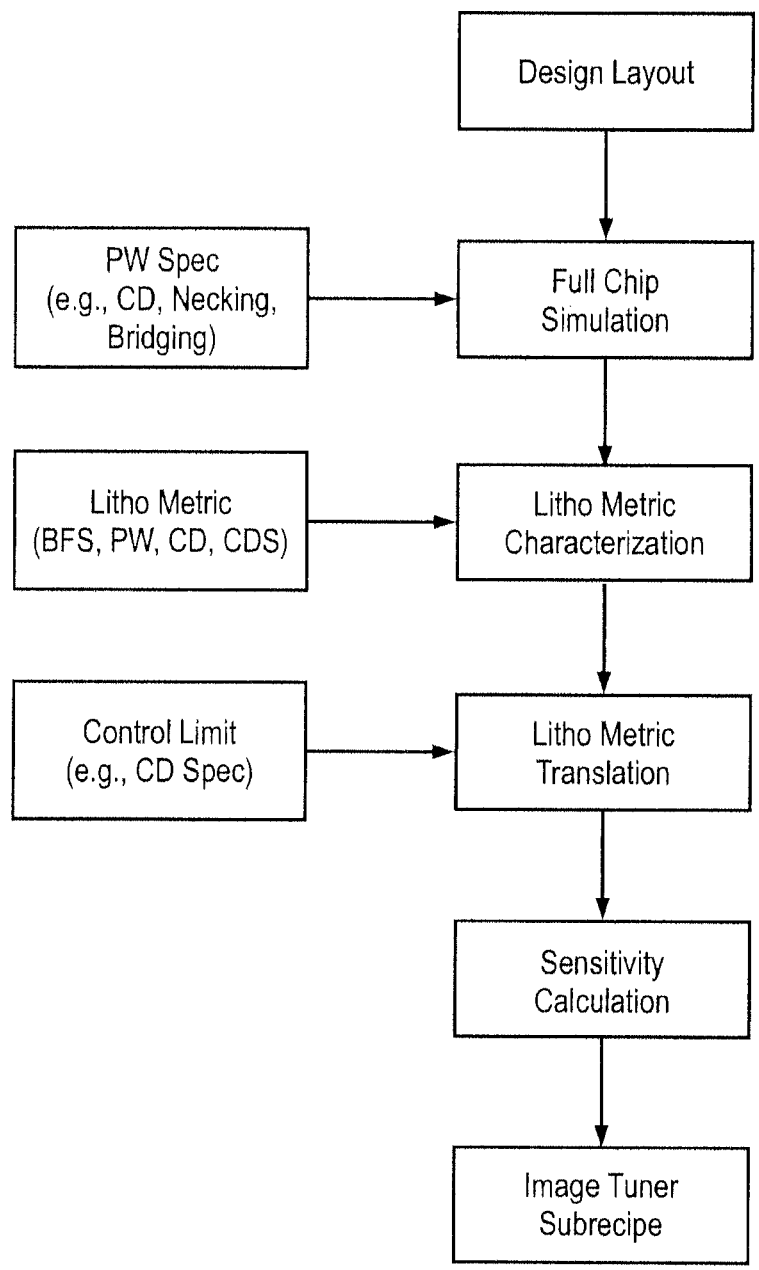
FIG. 12 illustrates application-specific lens heating control using an image tuner.

FIG. 12 illustrates application-specific lens heating control using an image tuner. Full chip simulation can be useful in optimizing hot spot reduction. Litho metric characterization can express a litho metric L as a function of Zernike $l_i(z_i)$. The litho metric translation component can then translate the litho metric L into Zernike based metric $J_k(z_i)$.

Figure 13:
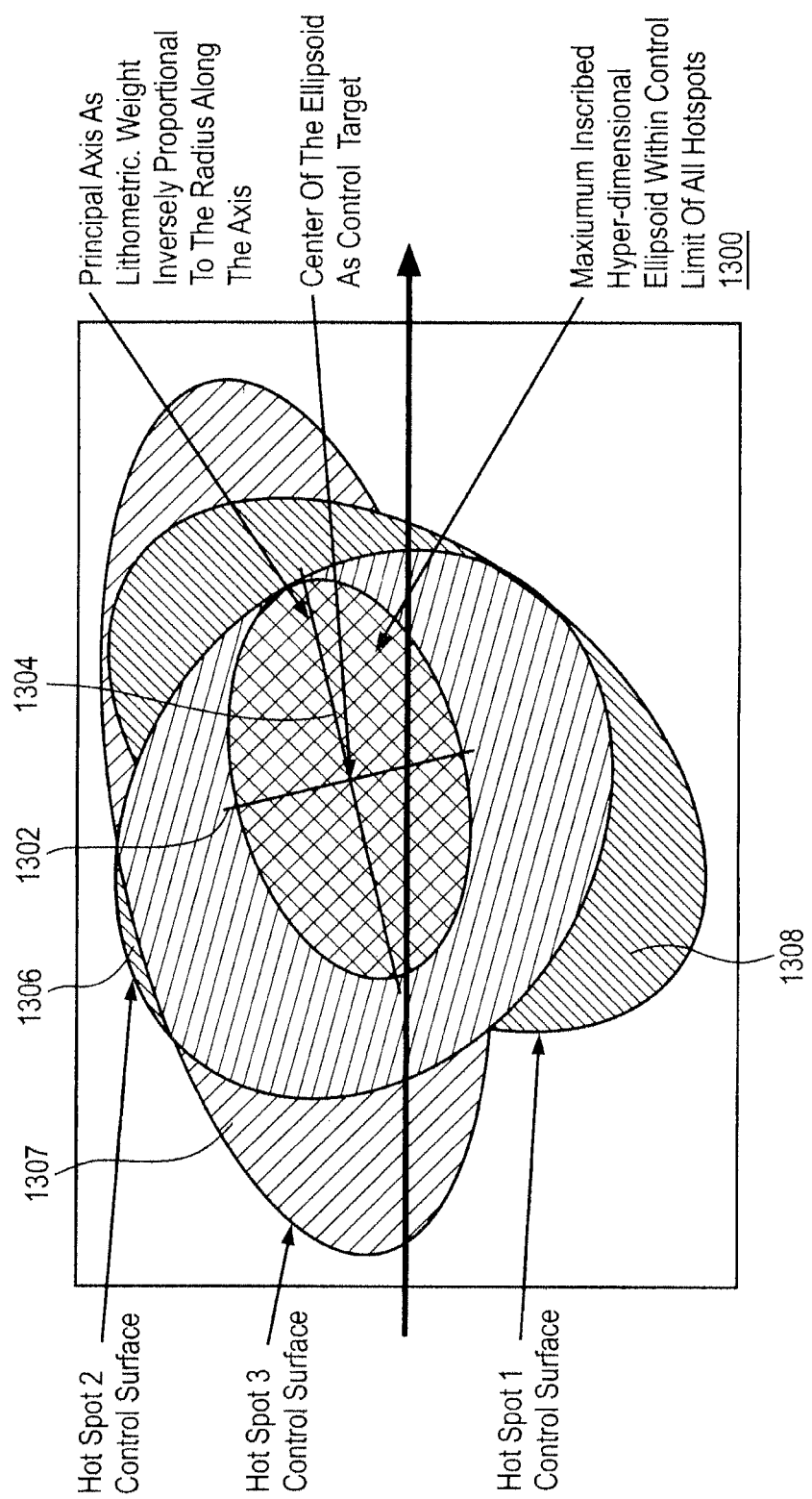
FIG. 13 is a graph illustrating litho metrics construction.

FIG. 13 graphically illustrates litho metrics construction wherein the solution volume is approximated by the maximum inscribed hyper-dimensional ellipsoid 1300 within the control surfaces of individual hotspots 1306-1308. The unit vectors of the principal axes 1302 and 1304 may be used as the linearized litho metrics with the weights inversely proportional to the axis lengths.

In one example, results for a 59 nm flash device clip were obtained. The clip can be characterized as having dipole source with pole angle of 90 degree and ring width of 0.18, unpolarized source. 1401 BALE correction was employed and a lens heating model based on full chip diffraction pattern and reticle transmission was used. Regarding hot spot selection, one dimensional patterns exhibited a deviation from cold lens best condition CD of less than 10 percent. For all other patterns minimum contour CD<75% cold lens best condition contour CD. Lens heating modeling and verification was conducted with Tachyon FEM and Tachyon LMC with clips placed on both center and edge slit positions. For necking hot spots, simulation of Image Tuner correction may be appreciated with reference to FIGS. 14 and 15. Image tuner correction was found to provide improvement closer to cold lens state and showed slightly bigger through slit variation. The disclosed image tuner lens showed a 2-3 times CDU improvement in comparison to a conventional lens model. For many hot spots the deviation between cold lens and hot lens models show >10% difference in CD (W0 case). The simulation shows that Image Tuner correction obtained a deviation reduced to <10% for all hot spots, for both center and edge slit positions (W5 case).

Certain embodiments incorporate lens heating modeling full-chip lithography simulation systems. Full-chip verification can be applied to identify lens heating induced hot spots and verify lens heating corrections and lens heating aware OPC can be used to mitigate the lens heating impact on image quality. Full-chip simulations can be used to generate application specific recipes to be fed into the Image Tuner, which has the potential of improving imaging performance in the presence of lens heating, as compared to conventional lens models.

Additional Descriptions of Certain Aspects of the Invention

The foregoing descriptions of the invention are intended to be illustrative and not limiting. For example, those skilled in the art will appreciate that the invention can be practiced with various combinations of the functionalities and capabilities described above, and can include fewer or additional components than described above. Certain additional aspects and features of the invention are further set forth below, and can be obtained using the functionalities and components described in more detail above, as will be appreciated by those skilled in the art after being taught by the present disclosure.

Certain embodiments of the invention provide methods for calibrating a photolithographic system. Some of these embodiments comprise generating a cold lens contour for a reticle design, generating at least one hot lens contour for the reticle design, characterizing aberrations induced by a lens manipulator in a manipulator model and optimizing a process window using the manipulator model, wherein the process window is based on the cold lens contour and the at least one hot lens contour. In some of these embodiments, generating a contour includes performing diffraction calculations based on the reticle design. In some of these embodiments, the cold lens contour is generated while the lens is maintained within a nominal operating temperature range. In some of these embodiments, a hot lens contour is generated after working portions of the lens have been heated by light transmission. In some of these embodiments, the manipulation model causes manipulation of a lens of the photolithographic system according to manipulator settings calculated to provide an optimum process window.

In some of these embodiments, generating the cold lens contour includes using a model based on measurements obtained while the lens is maintained within a nominal operating temperature range. In some of these embodiments, each hot lens contour is generated using a corresponding lens heating model, wherein the lens heating model characterizes light-induced heating of the lens in a photolithographic process. In some of these embodiments, optimizing the process window includes minimizing variations in critical dimensions caused by lens heating by inducing other variations in critical dimensions caused by lens aberrations. In some of these embodiments, the step of characterizing aberrations includes, identifying variations in critical dimensions caused by lens aberrations for a plurality of manipulator settings and modeling behavior of the manipulator as a linear relationship between manipulator settings and aberrations.

Some of these embodiments further comprise identifying first variations in critical dimensions caused by lens heating. In some of these embodiments, characterizing aberrations includes modeling behavior of the manipulator as a linear relationship between manipulator settings and the induced aberrations and identifying second variations in the critical dimensions caused by the induced aberrations for a plurality of manipulator settings. In some of these embodiments, the critical dimensions are identified in an image of the reticle. In some of these embodiments, the first variations in critical dimensions are expressed as a function of lens heating. In some of these embodiments, the second variations in critical dimensions are expressed as a function of manipulator setting.

In some of these embodiments, the first and second variations in the critical dimensions are expressed as a function of Zernikes. In some of these embodiments, Zernike coefficients represent perturbations in the critical dimensions caused by the manipulator. In some of these embodiments, Zernikes coefficients characterize the manipulator induced aberrations. In some of these embodiments, Zernike coefficients represent perturbations in the critical dimensions caused by lens heating.

In some of these embodiments, optimizing a process window includes generating a cost function for a set of critical locations. In some of these embodiments, optimizing a process window includes generating a cost function for a set of critical hotspots. In some of these embodiments, wherein optimizing a process window includes minimizing the cost function. In some of these embodiments, minimizing the cost function includes calculating a gradient of the cost function using one of a deepest descent method and a conjugate gradient method.

Certain embodiments of the invention provide device manufacturing methods for calibrating a photolithographic system. Some of these embodiments comprise (a) providing a substrate that is at least partially covered by a layer of radiation-sensitive material, (b) providing a projection beam of radiation using an imaging system and generating a mask utilized to endow the projection beam with a pattern in its cross-section, and (c) projecting the patterned beam of radiation onto a target portion of the layer of radiation-sensitive material. In some of these embodiments, step (b) comprises generating a cold lens contour for the mask, generating at least one hot lens contour for the mask, characterizing aberrations induced by a lens manipulator in a manipulator model and optimizing a process window using the manipulator model. In some of these embodiments, the process window is based on the cold lens contour and the at least one hot lens contour. In some of these embodiments, step (c) comprises manipulating a lens of the photolithographic system according to manipulator settings calculated to provide an optimum process window.

Certain embodiments of the invention provide a computer readable medium bearing a computer program for calibrating a photolithographic system according to the methods recited above. For example, the computer program in some of embodiments, when executed, causes a computer to perform the steps of generating a cold lens contour for a reticle design, generating at least one hot lens contour for the reticle design, characterizing aberrations induced by a lens manipulator in a manipulator model, and optimizing a process window using the manipulator model and, in some of these embodiments, the process window is based on the cold lens contour and the at least one hot lens contour.

Although the present invention has been described with reference to specific exemplary embodiments, it will be evident to one of ordinary skill in the art that various modifications and changes may be made to these embodiments without departing from the broader spirit and scope of the invention. Accordingly, the specification and drawings are to be regarded in an illustrative rather than a restrictive sense.

What is claimed is:

1. A method of performing optical proximity correction (OPC) on a target design for a lithographic process, the method comprising:
   obtaining an optical system heating model that accounts for effects of optical system heating in the lithographic process;
   obtaining a set of process window conditions associated with the lithographic process;
   determining one or more pattern failures across the set of process window conditions using the optical system heating model;
   performing, by a hardware computer system, OPC on the target design based on the determined one or more pattern failures; and
   outputting an electronic representation of the corrected target design for creating the pattern as provided by a patterning device of the lithographic process.

2. A method according to claim 1, further comprising:
   obtaining a cold optical system model associated with a cold optical system state of the lithographic process,
   wherein determining one or more pattern failures is performed by combining results using the cold optical system model and the optical system heating model.

3. A method according to claim 2, further comprising:
   identifying a plurality of hot optical system states of the lithographic process,
   wherein determining one or more pattern failures is performed by accounting for the plurality of hot optical system states using the cold optical system model and the optical system heating model.

4. A method according to claim 1, further comprising:
   obtaining a set of slit positions associated with an optical system of the lithographic process,
   wherein determining one or more pattern failures is further performed across the set of slit positions.

5. A method according to claim 1, wherein the one or more pattern failures include bridging and/or necking.

6. A method according to claim 1, wherein performing OPC includes adjusting edges of features in the target design.

7. A method according to claim 1, wherein the optical system heating model comprises a physics-based predictive model.

8. A method according to claim 7, wherein the optical system heating model is an optical system heating model formed using actual measurements of the lithographic process.

9. A non-transitory computer readable storage medium having instructions stored thereon which, when executed by a computer, cause the computer to implement a method of performing optical proximity correction (OPC) on a target design for a lithographic process, the method comprising:
   obtaining an optical system heating model that accounts for effects of optical system heating in the lithographic process;

obtaining a set of process window conditions associated with the lithographic process;

determining one or more pattern failures across the set of process window conditions using the optical system heating model;

performing OPC on the target design based on the determined one or more pattern failures; and outputting an electronic representation of the corrected target design for creating the pattern as provided by a patterning device of the lithographic process.

10. A non-transitory computer readable storage medium according to claim 9, wherein the method further comprises:

obtaining a cold optical system model associated with a cold optical system state of the lithographic process, wherein determining one or more pattern failures is performed by combining results using the cold optical system model and the optical system heating model.

11. A non-transitory computer readable storage medium according to claim 10, wherein the method further comprises:

identifying a plurality of hot optical system states of the lithographic process, wherein determining pattern one or more failures is performed by accounting for the plurality of hot optical system states using the cold optical system model and the optical system heating model.

12. A non-transitory computer readable storage medium according to claim 9, wherein the method further comprises:

obtaining a set of slit positions associated with an optical system of the lithographic process, wherein determining one or more pattern failures is further performed across the set of slit positions.

13. A non-transitory computer readable storage medium according to claim 9, wherein the one or more pattern failures include bridging and/or necking.

14. A non-transitory computer readable storage medium according to claim 9, wherein performing OPC includes adjusting edges of features in the target design.

15. A non-transitory computer readable storage medium according to claim 9, wherein the optical system heating model comprises a physics-based predictive model.

16. A non-transitory computer readable storage medium according to claim 15, wherein the optical system heating model is an ASCAL based optical system heating model formed using actual measurements of the lithographic process.

17. A system, comprising:
a hardware computer; and
a non-transitory computer readable storage medium having instructions stored thereon which, when executed by the computer, cause the computer to:

determine one or more pattern failures across a set of process window conditions associated with a lithographic process using an optical system heating model that accounts for effects of optical system heating in the lithographic process;

perform optical proximity correction (OPC) on a target design of the lithographic process based on the determined one or more pattern failures; and output an electronic representation of the corrected target design for creating the pattern as provided by a patterning device of the lithographic process.

18. A system according to claim 17, wherein the instructions, when executed by the computer, cause the computer to determine one or more pattern failures by combining results using a cold optical system model associated with a cold optical system state of the lithographic process and the optical system heating model.

19. A system according to claim 18, wherein the instructions, when executed by the computer, cause the computer to determine one or more pattern failures by accounting for a plurality of hot optical system states of the lithographic process using the cold optical system model and the optical system heating model.

20. A system according to claim 17, wherein the instructions, when executed by the computer, cause the computer to determine one or more pattern failures across a set of slit positions associated with an optical system of the lithographic process.

21. A system according to claim 17, wherein the one or more pattern failures include bridging and/or necking.

22. A system according to claim 17, wherein the instructions, when executed by the computer, that cause the computer to perform optical proximity correction cause the computer to adjust edges of features in the target design.

23. A system according to claim 17, wherein the optical system heating model comprises a physics-based predictive model.

24. A system according to claim 23, wherein the optical system heating model is an optical system heating model formed using actual measurements of the lithographic process.

* * * * *